United States Patent
Ito et al.

(10) Patent No.: US 6,927,623 B2
(45) Date of Patent: Aug. 9, 2005

(54) AMPLITUDE-MODULATED SIGNAL RECEIVING CIRCUIT

(75) Inventors: Yasuhiro Ito, Tokyo (JP); Yasuaki Nishida, Tokyo (JP); Takashi Ando, Tokyo (JP); Kazuhiro Daikoku, Tokyo (JP); Shinichi Hosoya, Tachikawa (JP)

(73) Assignees: Nippon Hoso Kyokai, Tokyo (JP); NHK Engineering Services, Inc., Tokyo (JP); RCOM Corporation, Tokyo (JP); Japan Kyastem Co., Ltd., Tokyo (JP)

( * ) Notice: Subject to any disclaimer, the term of this patent is extended or adjusted under 35 U.S.C. 154(b) by 219 days.

(21) Appl. No.: 10/274,447

(22) Filed: Oct. 18, 2002

(65) Prior Publication Data

US 2003/0102906 A1 Jun. 5, 2003

(30) Foreign Application Priority Data

Oct. 24, 2001 (JP) ......................................... 2001-326581

(51) Int. Cl.[7] ................................................ H03D 1/04
(52) U.S. Cl. .................... 329/349; 329/316; 329/361; 329/357; 329/358; 455/130; 375/324
(58) Field of Search .................................. 329/361, 357, 329/358; 375/324; 455/130

(56) References Cited

U.S. PATENT DOCUMENTS

| | | | |
|---|---|---|---|
| 4,307,347 A | * 12/1981 | Thomson | 329/358 |
| 4,945,313 A | 7/1990 | Brilka et al. | 329/349 |
| 5,548,243 A | 8/1996 | Sun et al. | 329/316 |

FOREIGN PATENT DOCUMENTS

WO    PCT/IL00/00723    5/2001

OTHER PUBLICATIONS

German Patent Document DE4404888A1, Sep. 1, 1994.

* cited by examiner

*Primary Examiner*—Arnold Kinkead
(74) *Attorney, Agent, or Firm*—John Russell Uren

(57) ABSTRACT

To improve the quality of the demodulated signal without altering the form in which an AM radio wave is transmitted, the received amplitude-modulated signal is converted to a single-sideband signal, and the information signal demodulated from the phase term of this converted single-sideband signal.

4 Claims, 12 Drawing Sheets

AMPLITUDE-MODULATED SIGNAL RECEIVING CIRCUIT

BACKGROUND OF THE INVENTION

1. Field of the Invention

The present invention relates to an amplitude-modulated signal receiving circuit for receiving and demodulating AM (here signifying double sideband emitted carrier amplitude modulation) signals that are widely employed in the medium-frequency (medium wave) and high-frequency (short wave) bands. The invention relates more particularly to techniques for improving the quality of the demodulated signal.

2. Description of Related Art

Given the level of technology when practical AM receivers became available, and given the requirement at that time for a simple yet economic demodulation scheme that did not need an elaborate demodulation circuit, the demodulation method adopted was envelope detection (demodulation), which is the simplest method.

Nowadays, AM broadcasting is the most representative example of the utilization of amplitude modulation. Because a great many people throughout the world can receive and make use of AM broadcasting, there are a large number of receivers in existence. Historically speaking, the above-mentioned detection (demodulation) method was certainly the best available when AM broadcasting became practical.

Moreover, because an AM signal can be demodulated by means of envelope detection, great important is attached, in its application to aircraft radio, to the characteristic that such demodulation is largely independent of the frequency stability of the radio equipment, and hence this technique is still in use today, even though the quality of the demodulated signal is poor.

The following problems have been encountered with conventional AM signal demodulation techniques.

1. Due to amplitude and phase fluctuations that occur in the propagation path through which an AM signal propagates, it is difficult to obtain high-quality demodulated signals using conventional demodulation techniques. Sources of such amplitude and phase fluctuations include, for example, multiplicative disturbance caused by fading, etc., and power source noise, fluorescent light noise and city noise.
2. Amplitude modulation technology has a long history, and the technical level prevailing when it first came into practical use was such that modulation schemes did not employ measures to remove these disturbances and thereby obtain high-quality demodulated signals.
3. An AM broadcast wave is transmitted with 400 Hz referenced to 0 dB, and with the 50 Hz to 7500 Hz range held within 1.5 dB to −3 dB. However, the bandpass characteristics of the receiver are less flat than those of the transmitted wave, and even if these bandpass characteristics are adjusted for sound quality after reception and demodulation, audio quality cannot be improved. The main reason for this is that conventional demodulation technology provides no means for removing the multiplicative noise that affects an AM signal. Moreover, because the signal is susceptible to additive noise as well, AM receivers are designed to have single-peak receiving bandpass characteristics so as to be more audible. Accordingly, despite the need for flat frequency characteristics over a sufficiently wide bandwidth, existing receivers cannot guarantee really excellent sound quality for audio sources such as music.
4. Although automatic gain control circuits are used to automatically control the received input power level, these circuits are not sufficient to improve the quality of the demodulated signal.

SUMMARY OF THE INVENTION

It is therefore an object of the present invention to provide an amplitude-modulated signal receiving circuit capable of receiving an AM signal and obtaining a high-quality demodulated signal without having to alter the radio regulation in which AM radio waves are currently transmitted.

A receiving circuit for an amplitude-modulated signal according to the present invention (hereinafter referred to as an "AM signal receiving circuit") comprises conversion means for converting the received amplitude-modulated signal to a single-sideband full carrier signal, and demodulation means for demodulating the information signal from the phase term of the converted single-sideband signal.

The present invention demodulates the information signal from the phase term of an amplitude-modulated signal. The rationale for this approach is as follows: namely, the information signal component present in the phase term of the modulated signal is not susceptible to external multiplicative or additive noise and as a result can provide excellent transmission quality. As an illustration of this, the fact that the receiving characteristics of FM broadcasts are better than those of AM broadcasts is because with frequency-modulated signals the information signal component is present only in the phase term and is demodulated from this term.

The demodulation means preferably comprises processing means for demodulating the information signal from the phase term—i.e., from the real zeros—of a single-sideband signal. A demodulation processing technique of this sort is known as Real Zero Single Sideband (RZ SSB) modulation and demodulation, and is capable of removing, during the demodulation process, amplitude distortion due to external noise. Details of RZ SSB modulation and demodulation are given in JP H06-018333 B (granted as Japanese Patent No. 1888866).

The conversion means for converting the received amplitude-modulated signal to a single-sideband signal preferably comprises frequency-conversion means for removing unwanted phase components, caused for example by the influence of the propagation path on the phase term or by frequency fluctuation of a local oscillator in the receiver, by branching the received amplitude-modulated signal into two and multiplying the two branched signals together after limiting the amplitude of one branched signal and frequency converting the other. If such means is provided in the intermediate frequency stage, it is not affected by the frequency stability of the local oscillator in the high-frequency stage, and a high-quality demodulated signal can be obtained. As a result, the present invention does not forfeit the important feature of conventional envelope demodulation, namely, that demodulation characteristics are independent of frequency fluctuation. At the same time, it can accurately maintain the frequency characteristics of the transmitted information signal.

Because an amplitude-modulated wave according to this invention comprises an upper sideband and a lower sideband, the conversion means for converting the received amplitude-modulated signal to a single-sideband signal preferably comprises frequency diversity means for superimposing the received amplitude-modulated signal and a signal resulting from reversing, in the frequency domain, the signal frequency component distribution of this received signal, and for converting the result to one single-sideband signal.

This frequency diversity means can comprise: means for branching the received amplitude-modulated emitted carrier signal into two; an amplitude limiter (hard limiter) for limiting the amplitude of one of the branched amplitude-modulated emitted carrier signals; first frequency-conversion means for using a local oscillator signal to frequency convert the other branched amplitude-modulated emitted carrier signal, and for extracting the difference frequency component and the sum frequency component; second frequency-conversion means for using the output of the amplitude limiter (the hard limiter) to frequency convert the difference frequency component that has been extracted by the first frequency-conversion means, and for extracting the resulting sum frequency component; third frequency-conversion means for using the output of the amplitude limiter (the hard limiter) to frequency convert the sum frequency component that has been extracted by the first frequency-conversion means, and for extracting the resulting difference frequency component; and means for adding the output of the second frequency-conversion means and the output of the third frequency-conversion means.

The AM signal receiving circuit of this invention is preferably implemented using digital signal processing (DSP) technology, so that high-performance processing of the received signal can be carried out by an inexpensive circuit. Use of such technology renders circuit adjustment unnecessary and means that DSP processors can be used, which can be expected to offer volume production benefits. As a result, an economic receiver is assured.

BRIEF DESCRIPTION OF THE DRAWINGS

Specific embodiments of the present invention will now be described, by way of example only, with reference to the accompanying of drawings in which.

DETAILED DESCRIPTION OF THE PREFERRED EMBODIMENTS

Examples of receiving circuits for receiving an AM radio signal will now be described to illustrate modes of embodying the present invention. The following embodiments serve to clarify the substance of this invention. Nevertheless, the invention is not restricted to these embodiments.

First Embodiment

Figure 1:
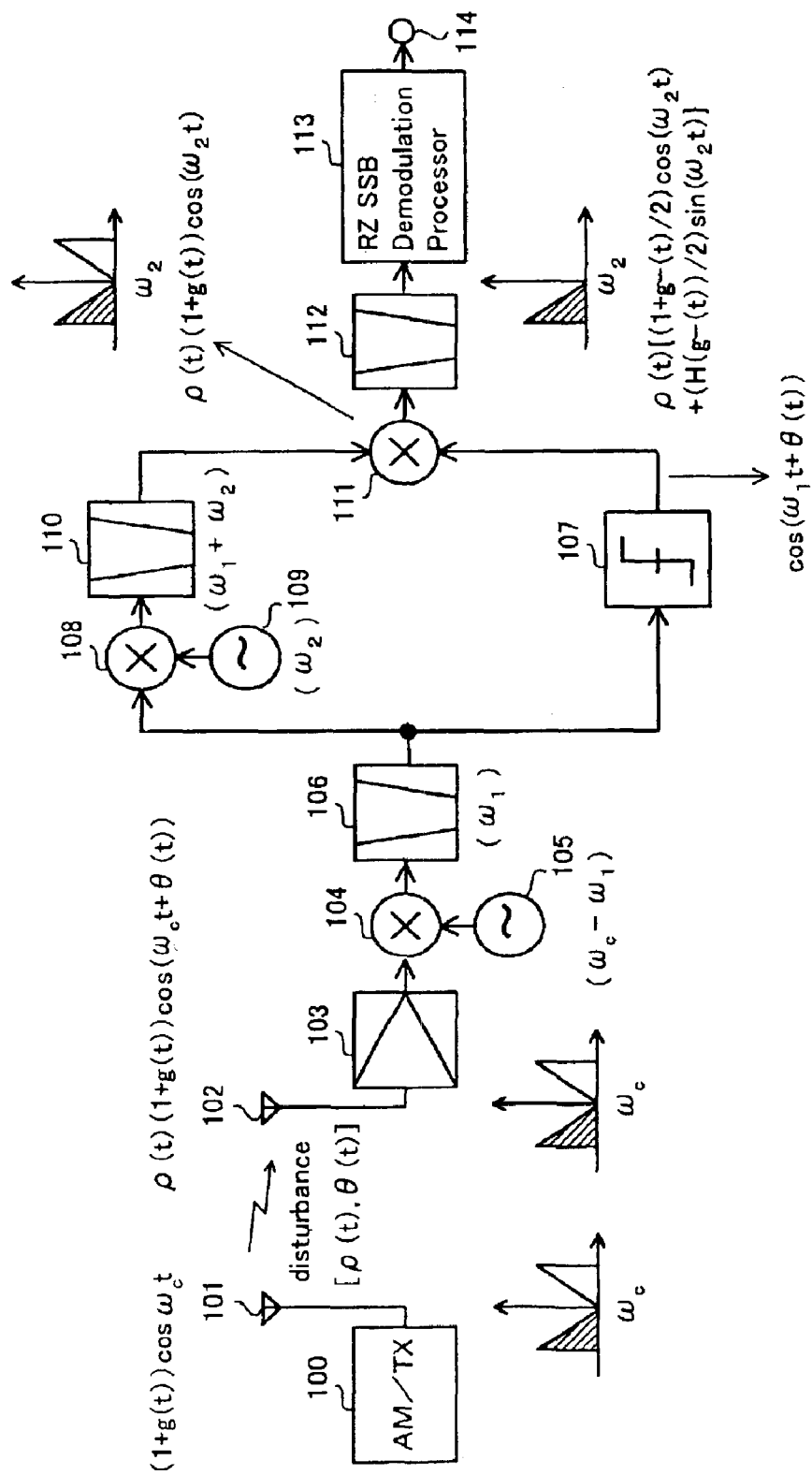
FIG. 1 is a block diagram of a first embodiment of the present invention.
Figure 2:
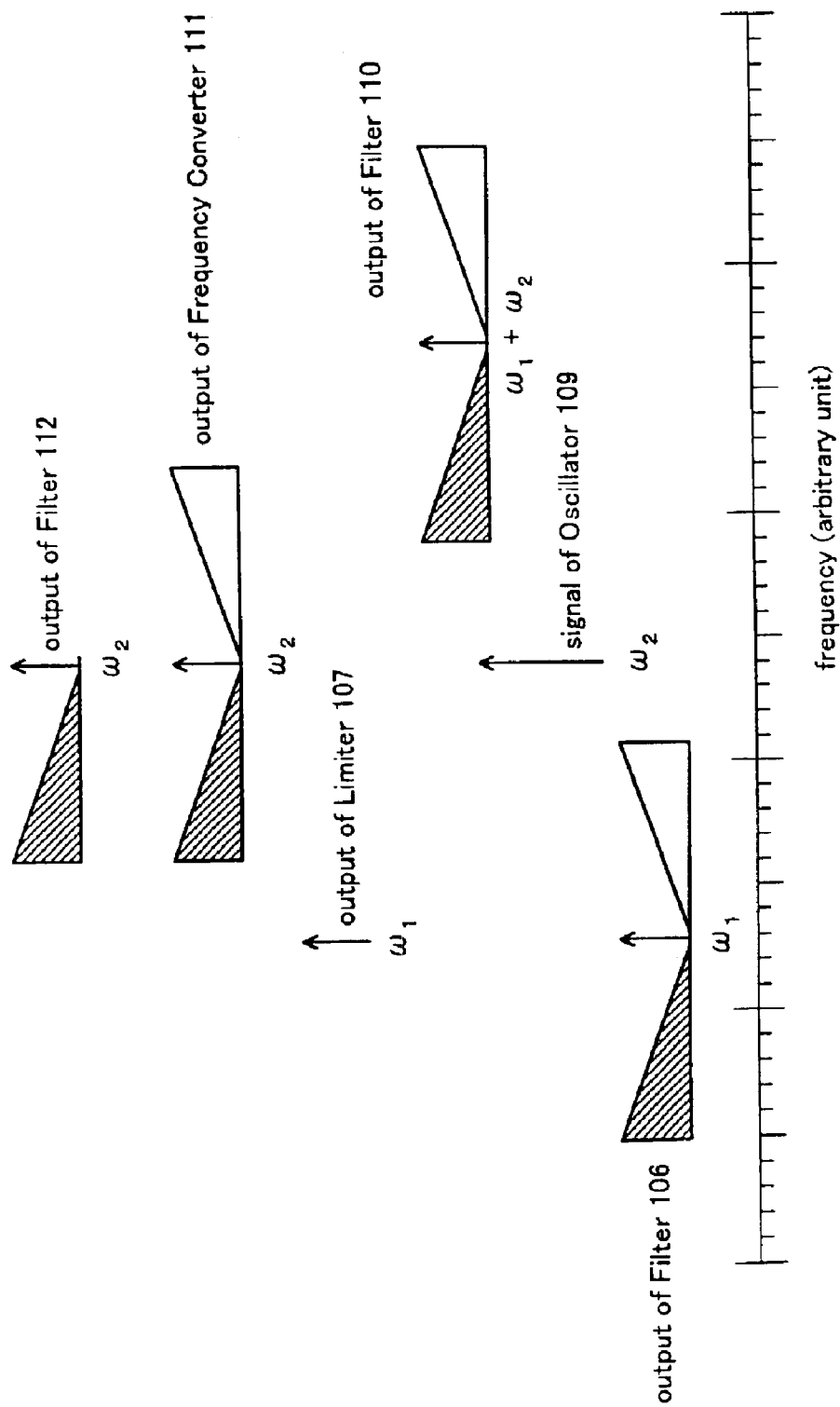
FIG. 2 shows an exemplary arrangement in the frequency domain of sidebands and carrier components during the frequency conversions taking place in the AM signal receiving circuit shown in FIG. 1.

A first embodiment of the present invention will be described with reference to FIG. 1 and FIG. 2. FIG. 1 is a block diagram of this first embodiment. FIG. 2 shows an exemplary arrangement in the frequency domain of sidebands and carrier components during the frequency conversions taking place in the AM signal receiving circuit. The embodiment depicted in FIG. 1 comprises AM transmitter 100, transmitting antenna 101, receiving antenna 102 of the AM receiver, front-end amplifier 103, frequency converter 104, local oscillator 105, intermediate frequency (IF) filter 106, amplitude limiter (hard limiter) 107, frequency converter 108, local oscillator 109, IF filter 110, frequency converter 111, IF filter 112, RZ SSB demodulation processor 113, and AM demodulated signal output terminal 114.

A brief description will now be given of signal flow in this first embodiment shown in FIG. 1, and of the functioning of its component circuits.

The output of AM transmitter 100 is transmitted as an amplitude-modulated wave by transmitting antenna 101. This amplitude-modulated wave is received by antenna 102 of the AM receiver and, after it has been amplified by front-end amplifier 103, is converted to an IF signal—for example, to a difference frequency IF signal—by means of frequency converter 104, using the local oscillator signal from local oscillator 105, whereupon the required IF signal is extracted by IF filter 106.

This signal is split into two, and one portion supplied to amplitude limiter (hard limiter) 107 where it is converted to a fixed-amplitude signal. The other split portion of the signal is supplied to frequency converter 108 where the output of local oscillator 109 is used to convert it to a sum frequency signal. The required IF signal is then extracted by IF filter 110. The output signal of IF filter 110 and the output of amplitude limiter (hard limiter) 107 are converted by frequency converter 111 in such manner that the difference frequency signal can be formed. IF filter 112 extracts the lower sideband component, this being a signal from which some unwanted noise components have been removed and which is accompanied by a carrier. The output of IF filter 112 is supplied to RZ SSB demodulation processor 113 where it is demodulated, and the demodulated signal is output from terminal 114.

The operation of the component circuits will now be described using mathematical expressions. Writing the information signal as g(t), the amplitude-modulated wave to be transmitted from transmitting antenna 101 can be described as:

$$St1(t) = (1+g(t))\cos(\omega_c t) \quad (1)$$

where $\omega_c$ is the angular frequency of the transmitted wave. To ensure that the amplitude-modulated wave is not overmodulated, it is essential that:

$$|g(t)| < 1 \quad (2)$$

Next, we can transform Equation 1 as follows.

$$St1(t) = \cos(\omega_c t) + \\
\{g^+(t)\cos(\omega_c t) - H(g^+(t))\sin(\omega_c t)\}/2 + \\
\{g^-(t)\cos(\omega_c t) + H(g^-(t))\sin(\omega_c t)\}/2 \quad (3)$$

where $H(g(t))$ represents the Hilbert transformation of $g(t)$, and $g^+(t)$ and $g^-(t)$ respectively represent the information signal present in the upper sideband region and in the lower sideband region of the transmitted wave. Hence:

$$g^+(t) = g^-(t)$$

$$H(g^+(t)) = H(g^-(t))$$

The first term in Equation 3 represents the carrier component, the second term represents the upper sideband component, and the third term represents the lower sideband component. From Equation 3 it will be seen that in an AM signal that is not overmodulated—i.e., in an AM signal that satisfies the condition expressed by Equation 2—the carrier component is always 6 dB higher than the sideband components. In FIG. 1 and FIG. 2, the signals are depicted in such manner that the upper sideband component and the lower sideband component can be distinguished. Although Equation 1 and Equation 3 are mathematically equivalent, because we will be considering single sideband components, we will use Equation 3 whenever it is necessary to discuss extracting a specific single sideband component, i.e., specifically either the upper sideband component or the lower sideband component.

During its propagation, the signal radiated from transmitting antenna 101 is subject to random amplitude fluctuation and to phase fluctuation (termed "random FM noise"), which obey the Rayleigh distribution rule and can be represented respectively by $\rho(t)$ and $\theta(t)$ in the amplitude and phase terms. These amplitude and phase fluctuations affect the signal as multiplicative disturbances. Hence the signal that arrives at AM receiver antenna 102 is given by:

$$Sr1(t) = \rho(t)(1+g(t))\cos(\omega_c t + \theta(t)) \quad (4)$$

After the received signal has been amplified by front-end amplifier 103, which preferably changes its degree of amplification by means of an RSSI (Received Signal Strength Indication) signal, the difference frequency between this received signal and a local oscillator signal from local oscillator 105, which has a center angular frequency of $\omega_c - \omega_1$ and an angular frequency fluctuation of $\delta\omega$, is obtained by means of frequency converter 104. As a result, the received signal is converted to an IF signal with a center angular frequency of $\omega_1$. The required IF signal component alone is extracted from this signal by IF filter 106. If thermal noise added by front-end amplifier 103 is ignored, the extracted signal is easily found from Equation 4 to be:

$$S11(t) = \rho(t)(1+g(t))\cos((\omega_1 \pm \delta\omega)t + \theta(t)) \quad (5)$$

In this embodiment, we consider conventional frequency conversion in an AM receiver (i.e., in an AM receiver for medium-frequency or high-frequency AM broadcasts). Because the received medium-frequency or high-frequency signal is by its nature of relatively low frequency, it is often converted to an intermediate frequency $\omega_{IF1}$ using, as local oscillator frequency $\omega_{L1}$, a frequency that is higher than the received signal frequency $\omega_c$. This prevents admixture of spurious (unwanted) signals into the IF frequency region. If the sidebands of the received signal are observed when this is done, the upper and lower sidebands are seen to be reversed. If IF frequency $\omega_{IF1}$ thus obtained is converted to a lower IF frequency $\omega_{IF2}$ and if this second frequency conversion is likewise performed using a frequency that is higher than IF frequency $\omega_{IF1}$, the sidebands are again reversed and are thereby restored to their original arrangement. Although it is assumed that in practice this double conversion will be performed, in the present embodiment, for the sake of simplicity we have described a single-stage frequency conversion of the sort outlined in the preceding paragraphs. However, the present invention is not restricted to such an example. The same simplified version of frequency conversion is described in subsequent embodiments of the invention.

The signal represented by Equation 5 is split into two. One of the two split portions is supplied to amplitude limiter (hard limiter) 107 where it is converted to a fixed-amplitude signal:

$$S1 \text{ lim} = \cos((\omega_1 \pm \delta\omega)t + \theta(t)) \quad (6)$$

from which the random amplitude fluctuation component $\rho(t)$ has been removed. The other split portion of the signal is converted to an IF signal with a center angular frequency of $\omega_1 + \omega_2$ by using local oscillator 109 with angular frequency $\omega_2$ and forming the sum frequency by means of frequency converter 108. IF filter 110 then extracts only the required IF signal component, given by:

$$S12(t) = \rho(t)(1+g(t))\cos(((\omega_1 \pm \delta\omega) + \omega_2)t + \theta(t)) \quad (7)$$

When the output of amplitude limiter (hard limiter) 107, represented by Equation 6, and the output of IF filter 110, represented by Equation 7, are input to frequency converter 111 and their difference frequency component extracted, the signal obtained is:

$$S13(t) = \rho(t)(1+g(t))\cos(\omega_2 t) \quad (8)$$

In other words, the angular frequency fluctuation $\delta\omega$ and the random disturbance component $\theta(t)$ that were present in the phase term can be completely removed. At the same time, the angular frequency of the carrier component is converted to $\omega_2$. Consequently, frequency stability in the subsequent demodulation processing is dependent only on local oscillator 109. As a result, if angular frequency $\omega_2$ is low, frequency stability is not a practical problem. The use of sharp IF filter 112 serves to extract the lower sideband signal, this being a signal from which some unwanted noise components have been removed and to which a carrier component has been added. Omitting remaining noise components from the mathematical expression and employing the transformation used to obtain Equation 3, this signal can be represented by:

$$S14(t) = \rho(t)\{(1+g^-(t)/2)\cos(\omega_2 t) + (H(g^-(t))/2)\sin(\omega_2 t)\} \quad (9)$$

which indicates that a component corresponding to the lower sideband of the transmitted wave is extracted. Because this lower sideband plus carrier signal expressed by Equation 9 has a carrier component that, as mentioned previously, is 6 dB higher than the maximum value of the information signal, it can be used as an RZ SSB signal. The use of an RZ SSB demodulation processor enables the random amplitude component ρ(t) to be removed and thereby provides a high-quality demodulated information signal.

The signal processing after IF filter 106 can be performed by a DSP circuit. As explained above, when the lower sideband signal with added carrier component is extracted, frequency stability is determined solely by local oscillator 109, and therefore a filter with sharp cut-off characteristics is preferably used as IF filter 112. Other advantages of a filter implemented by a DSP circuit include the fact that temperature characteristics, etc., do not have to be taken into consideration.

If the circuit shown in FIG. 1 is implemented using a DSP device, in order to reduce the DSP power consumption, it is necessary to lower the sampling frequency of the RZ SSB demodulation processor. It is possible to shift the processing frequencies to a lower frequency region by inserting a frequency converter in the output of frequency converter 111. An example of such processing will be described below.

Figure 3:
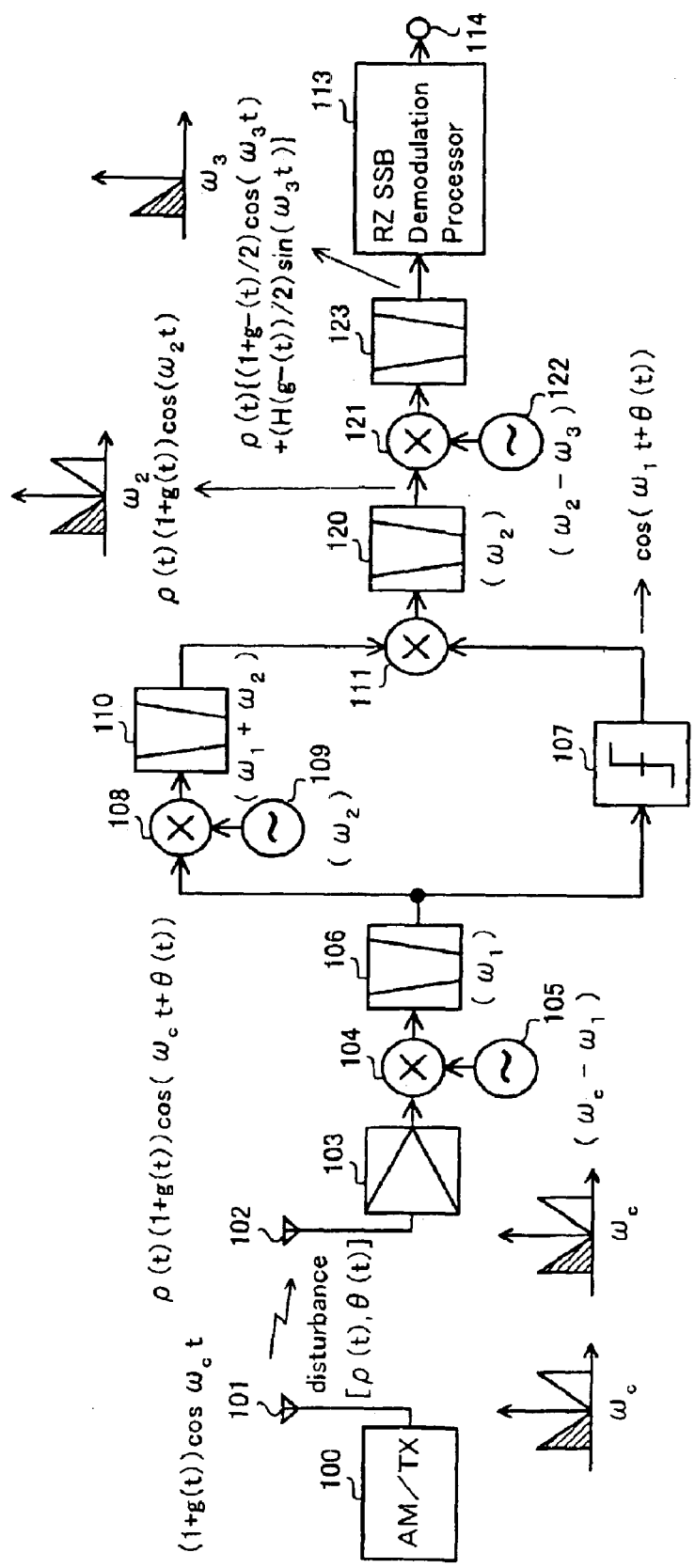
FIG. 3 is a block diagram of a configuration wherein the RZ SSB demodulation processing is performed in a lower frequency region, and represents a modification of the first embodiment of the invention.
Figure 4:
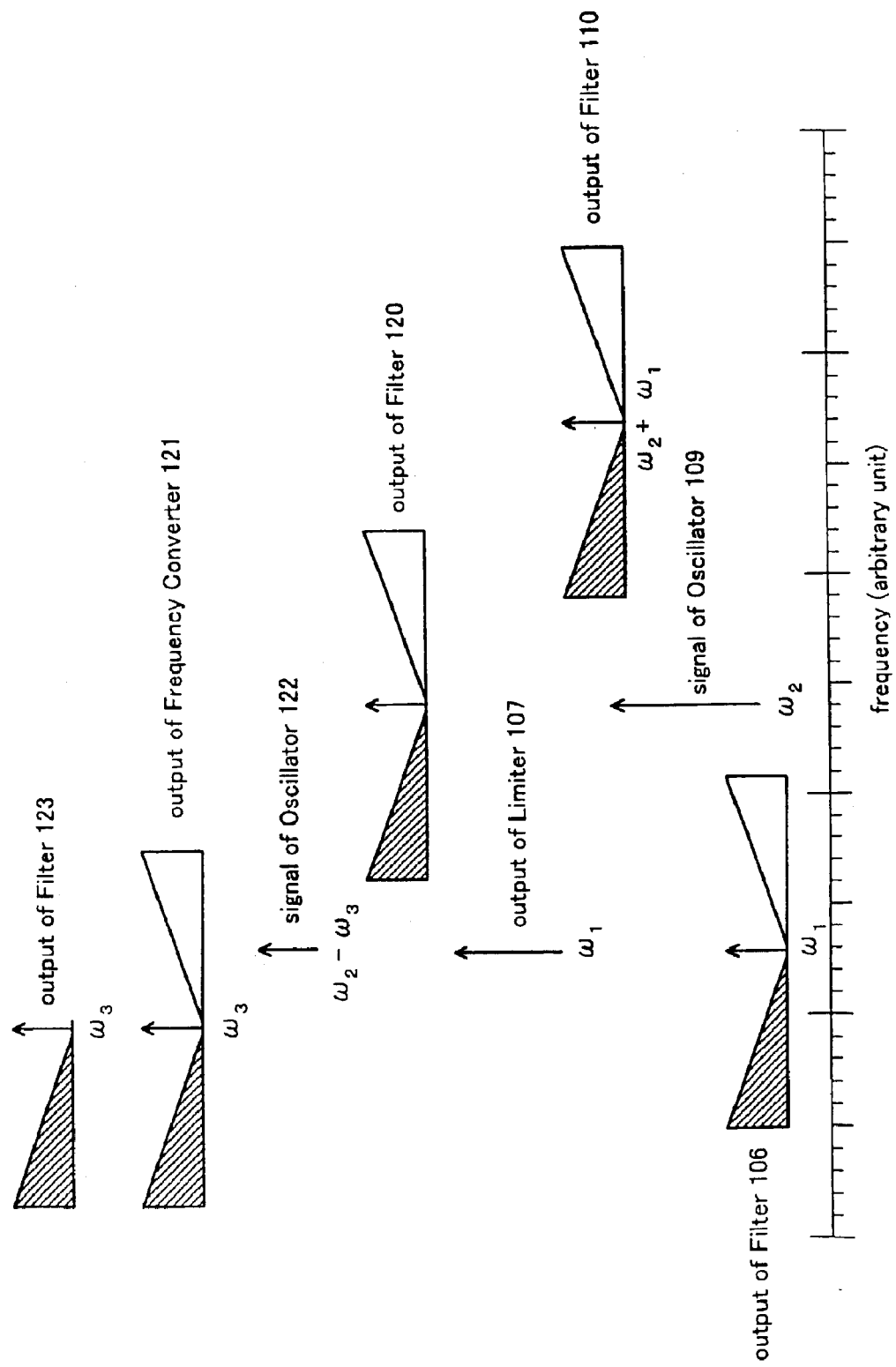
FIG. 4 shows an exemplary arrangement in the frequency domain of sidebands and carrier components during the frequency conversions taking place in the AM signal receiving circuit shown in FIG. 3.

FIG. 3 is a block diagram giving an example in which the signal processing frequency of the receiving circuit shown in FIG. 1 has been further decreased. FIG. 4 shows an exemplary arrangement in the frequency domain of sidebands and carrier components during the frequency conversions taking place in the AM signal receiving circuit shown in FIG. 3. The modified version of the first embodiment that is depicted in FIG. 3 comprises, in place of IF filter 112 shown in FIG. 1, IF filter 120, frequency converter 121, local oscillator 122 and IF filter 123.

A brief description will be given of the operation of the circuit depicted in FIG. 3. IF filter 120 is used to extract an AM signal of angular frequency $\omega_2$ from the output of frequency converter 111. This is converted to a lower frequency by frequency converter 121, using the output of local oscillator 122 with angular frequency $\omega_2-\omega_3$, whereupon IF filter 123 extracts the lower sideband signal to which a carrier component with angular frequency $\omega_3$ has been added. If the frequency region in which processing has to be carried out is lowered in this way, less unnecessary processing is performed, which contributes significantly to reducing power consumption.

Second Embodiment

Figure 5:
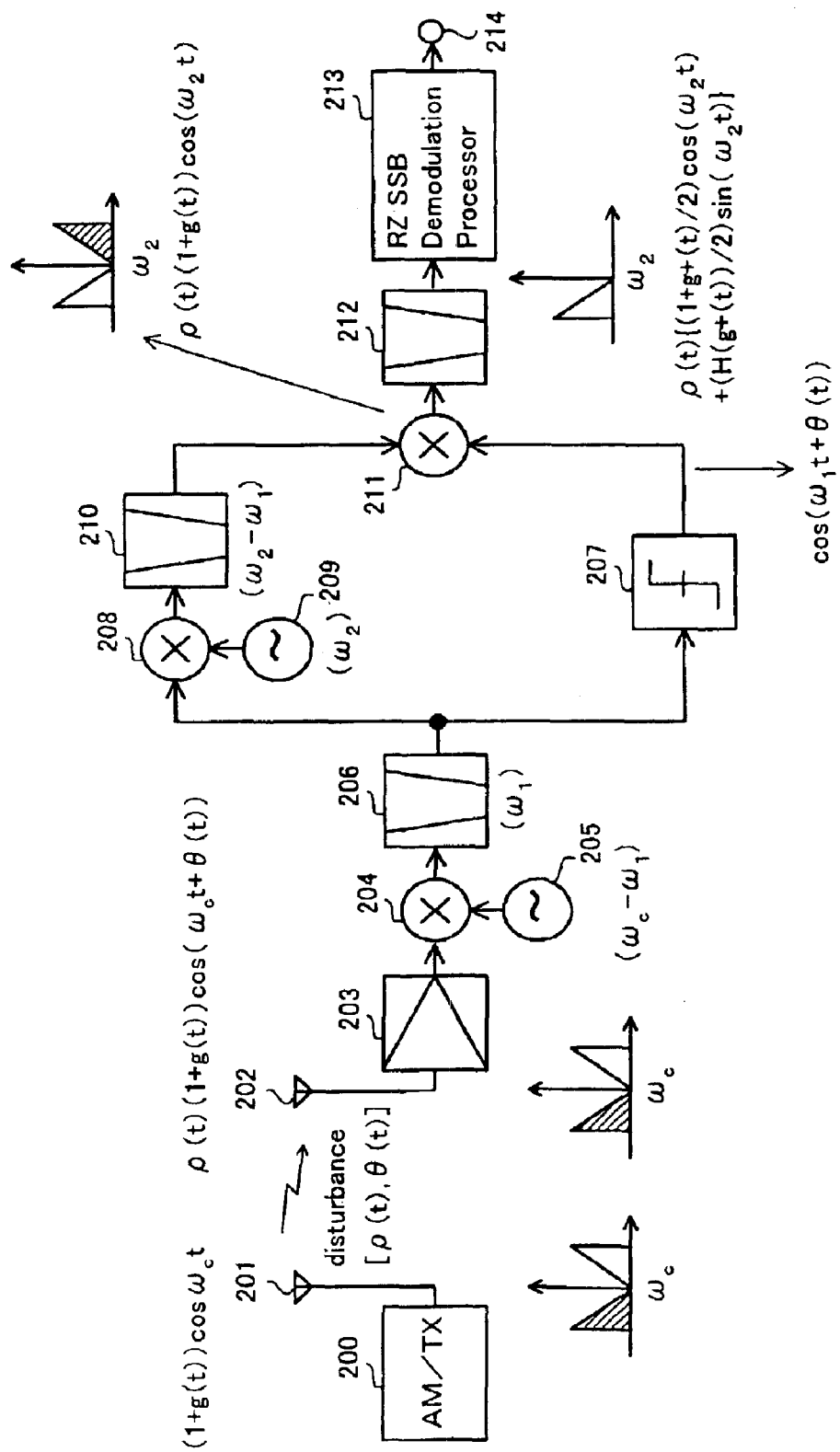
FIG. 5 is a block diagram of a second embodiment of this invention.
Figure 6:
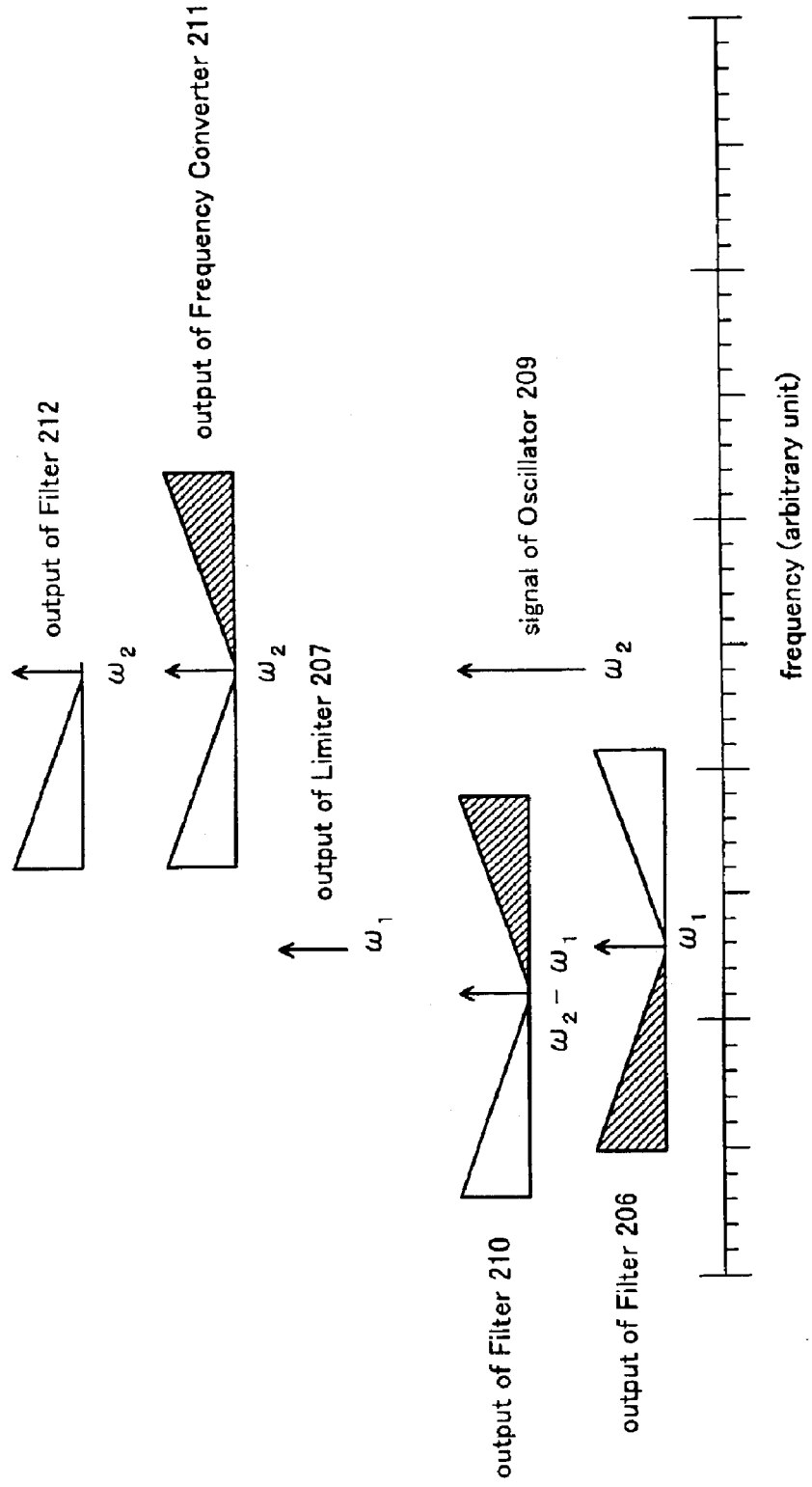
FIG. 6 shows an exemplary arrangement in the frequency domain of sidebands and carrier components during the frequency conversions taking place in the AM signal receiving circuit shown in FIG. 5.

A second embodiment of this invention will now be described with reference to FIG. 5 and FIG. 6. FIG. 5 is a block diagram of this second embodiment, while FIG. 6 shows an exemplary arrangement in the frequency domain of sidebands and carrier components during the frequency conversions taking place in the AM signal receiving circuit of FIG. 5. This second embodiment depicted in FIG. 5 comprises AM transmitter 200, transmitting antenna 201, receiving antenna 202 of the AM receiver, front-end amplifier 203, frequency converter 204, local oscillator 205, IF filter 206, amplitude limiter (hard limiter) 207, frequency converter 208, local oscillator 209, IF filter 210, frequency converter 211, IF filter 212, RZ SSB demodulation processor 213, and AM demodulated signal output terminal 214.

A brief description will now be given of signal flow in this second embodiment shown in FIG. 5, and of the functioning of its component circuits.

The output of AM transmitter 200 is transmitted as an amplitude-modulated wave by transmitting antenna 201. This amplitude-modulated wave is received by antenna 202 of the AM receiver and, after it has been amplified by front-end amplifier 203, is converted to a difference frequency signal by means of frequency converter 204 and local oscillator 205, whereupon the required IF signal is extracted by IF filter 206. This signal is split into two, and one portion supplied to amplitude limiter (hard limiter) 207 where it is converted to a fixed-amplitude signal. The other split portion of the signal is supplied to frequency converter 208, which forms the difference frequency between this input signal and the output of local oscillator 209. This difference frequency signal is then extracted by IF filter 210. Frequency converter 211 uses the output of IF filter 210 and the output of amplitude limiter (hard limiter) 207 to form the sum frequency component. IF filter 212 extracts the lower sideband component, this being a signal from which some unwanted noise components have been removed and which is accompanied by a carrier. The output of IF filter 212 is supplied to RZ SSB demodulation processor 213 where it is demodulated, and the demodulated signal is output from terminal 214.

The operation of the component circuits will now be described using mathematical expressions. Writing the information signal as g(t), the AM broadcast wave to be transmitted from transmitting antenna 201 is:

$$St2(t)=(1+g(t))\cos(\omega_c t) \quad (10)$$

where $\omega_c$ in this equation is the angular frequency of the transmitted wave. To ensure that the AM wave is not overmodulated, it is essential that:

$$|g(t)|<1 \quad (11)$$

During its propagation, the signal radiated from transmitting antenna 201 is subject to multiplicative disturbances that can be represented respectively by ρ(t) and θ(t) in the amplitude and phase terms. Hence the signal that arrives at AM receiver antenna 202 is given by:

$$Sr2(t)=\rho(t)(1+g(t))\cos(\omega_c t+\theta(t)) \quad (12)$$

After the received signal has been amplified by front-end amplifier 203, the difference frequency between this received signal and a local oscillator signal from local oscillator 205, which has a center angular frequency of $\omega_c-\omega_1$ and an angular frequency fluctuation of δω, is obtained by means of frequency converter 204. As a result, the received signal is converted to an IF signal with a center angular frequency of $\omega_1$. The required IF signal component alone is extracted from this signal by IF filter 206. The extracted signal is found from Equation 12 to be:

$$S21(t)=\rho(t)(1+g(t))\cos((\omega_1\pm\delta\omega)t+\theta(t)) \quad (13)$$

Note that thermal noise added by front-end amplifier 203 has been ignored.

The signal described by Equation 13 is split into two. One of the two split portions is supplied to amplitude limiter (hard limiter) 207 where it is converted to a fixed-amplitude signal, given by:

$$S2\ \text{lim}=\cos((\omega_1\pm\delta\omega)t+\theta(t)) \quad (14)$$

The other split portion of the signal is converted to an IF signal (second intermediate frequency) with a center angular frequency of $\omega_2-\omega_1$ by using local oscillator 209 with angular frequency $\omega_2$ and obtaining the difference frequency by means of frequency converter 208. IF filter 210 then extracts only the required IF signal component, given by:

$$S22(t)=\rho(t)(1+g(t))\cos((\omega_2-(\omega_1\pm\delta\omega))t-\theta(t)) \quad (15)$$

It is assumed that $\omega_2 > \omega_1$. When the output of amplitude limiter (hard limiter) 207, represented by Equation 14, and the output of IF filter 210, represented by Equation 15, are input to frequency converter 211 and their sum frequency component extracted, the signal obtained is:

$$S23(t) = \rho(t)(1 + g(t))\cos(\omega_2 t) \tag{16}$$

In other words, the angular frequency fluctuation $\delta\omega$ and the disturbance component $\theta(t)$ that were present in the phase term can be completely removed. At the same time, the angular frequency of the carrier component is converted to $\omega_2$. Consequently, frequency stability in the subsequent demodulation processing is dependent only on local oscillator 209. As a result, if angular frequency $\omega_2$ is low, frequency stability is not a practical problem. The use of sharp IF filter 212 serves to extract the lower sideband signal, this being a signal from which some unwanted noise components have been removed and to which a carrier component has been added. Omitting remaining noise components from the mathematical expression and employing the transformation used to obtain Equation 3, this signal can be represented by:

$$S24(t) = \rho(t)\{(1 + g^+(t)/2)\cos(\omega_2 t) + (H(g^+(t))/2)\sin(\omega_2 t)\} \tag{17}$$

which indicates that a component corresponding to the upper sideband of the transmitted wave is extracted. If we refer to the representation of an AM received signal that was given in Equation 3, it will be seen that the relation between the sideband component in Equation 17 and the sideband component in Equation 9 corresponds to the relation between upper and lower sidebands.

As mentioned in the description of the first embodiment, it will be evident that a lower sideband signal that has been extracted in the form shown in Equation 17 can be used as an RZ SSB signal. Accordingly, the use of an RZ SSB demodulation processor enables the disturbance component $\rho(t)$ to be removed and thereby provides a high-quality demodulated information signal.

If the circuit shown in FIG. 5 is implemented using a DSP device, in order to reduce the DSP power consumption, it is necessary to lower the sampling frequency of the RZ SSB demodulation processor. It is possible to shift the processing frequencies to a lower frequency region by inserting a frequency converter in the output of frequency converter 211. An example of such processing will be described below.

Figure 7:
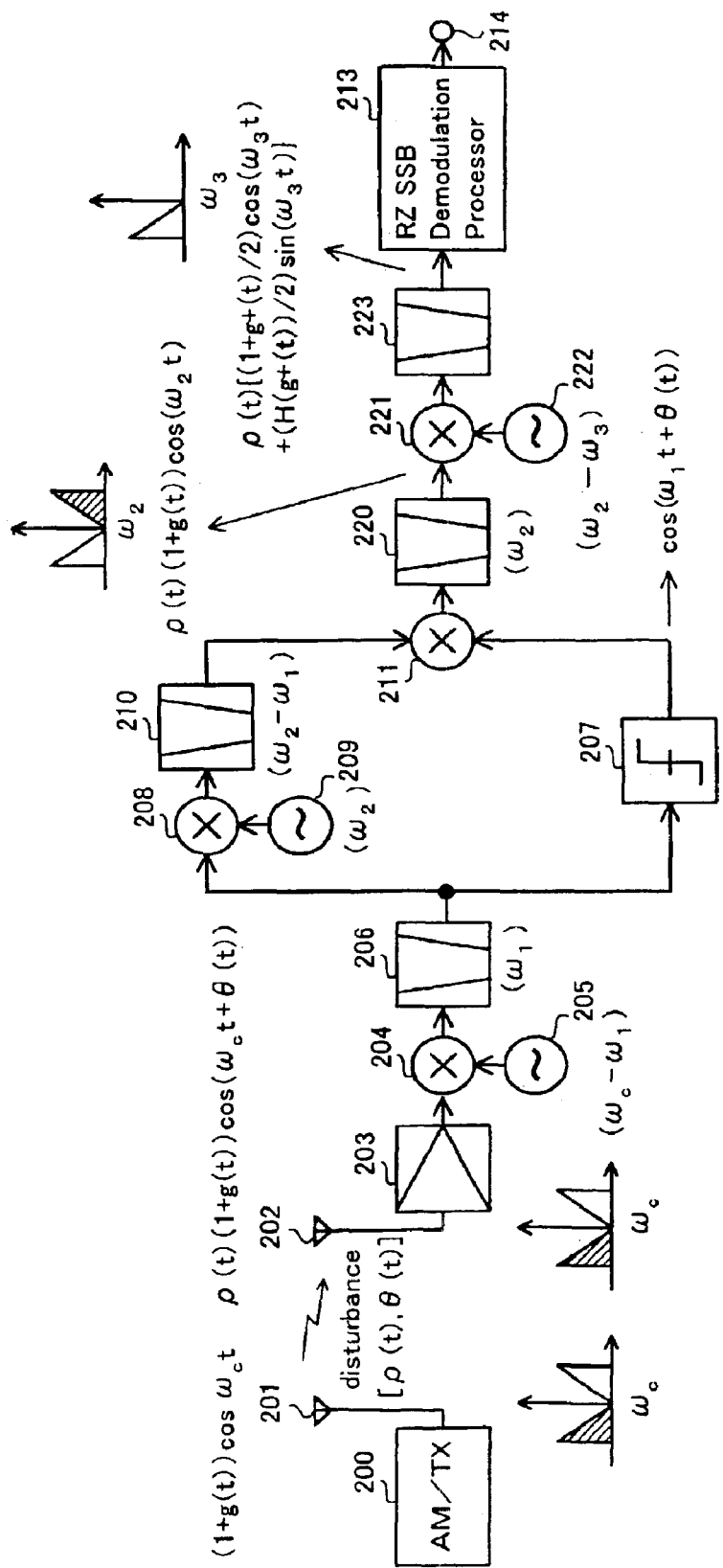
FIG. 7 is a block diagram of a configuration wherein the RZ SSB demodulation processing is performed in a lower frequency region, and represents a modification of the second embodiment of the invention.
Figure 8:
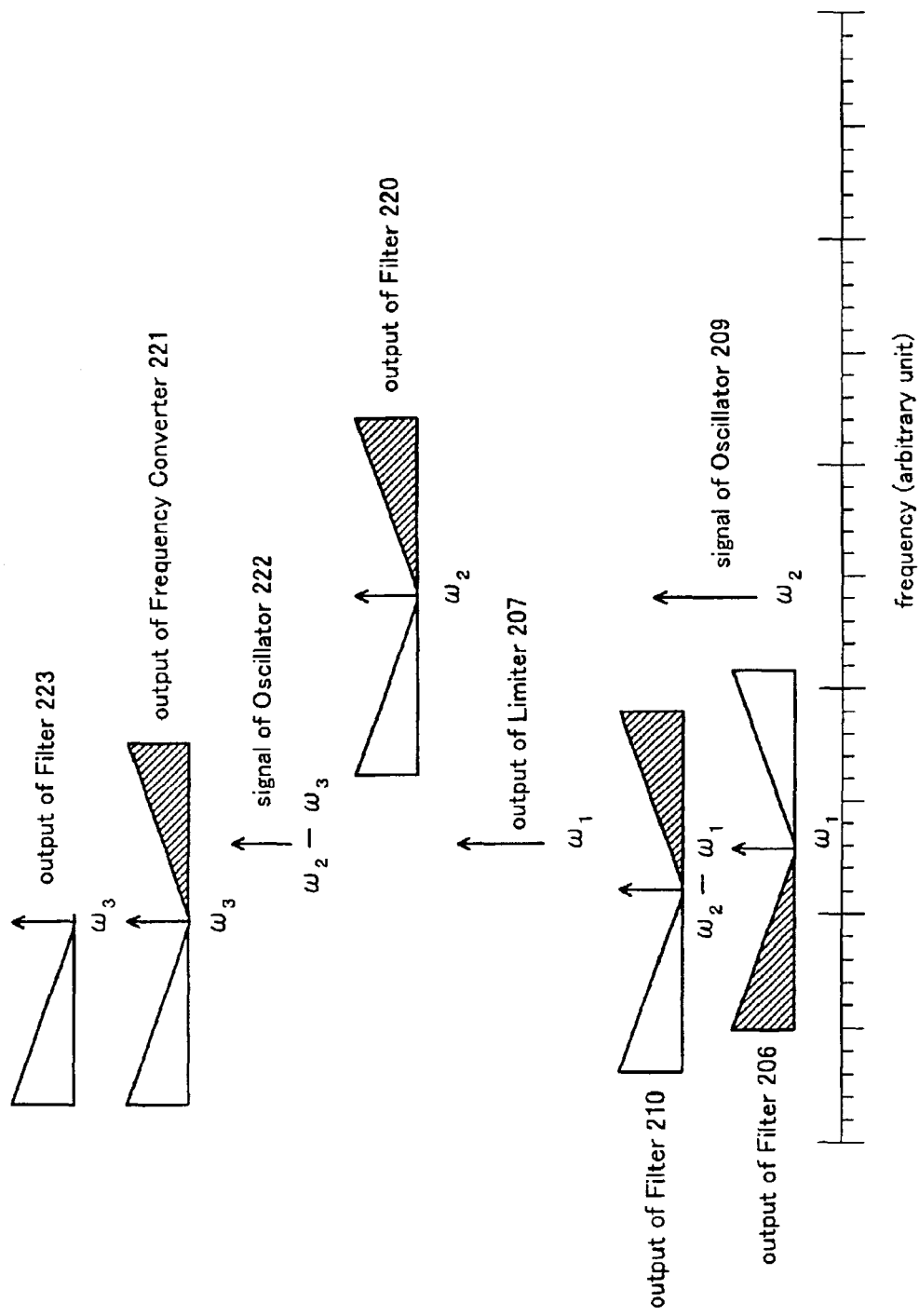
FIG. 8 shows an exemplary arrangement in the frequency domain of sidebands and carrier components during the frequency conversions taking place in the AM signal receiving circuit shown in FIG. 7.

FIG. 7 is a block diagram showing a modification of the receiving circuit shown in FIG. 5. FIG. 8 shows an exemplary arrangement in the frequency domain of sidebands and carrier components during the frequency conversions taking place in the AM signal receiving circuit shown in FIG. 7. The modified version of the second embodiment that is depicted in FIG. 7 comprises, in place of IF filter 212 shown in FIG. 5, IF filter 220, frequency converter 221, local oscillator 222, and IF filter 223.

A brief description will be given of the operation of the circuit depicted in FIG. 7. IF filter 220 is used to extract an AM signal of angular frequency $\omega_2$ from the output of frequency converter 211. This is converted to a lower frequency by frequency converter 221, using the output of local oscillator 222 with angular frequency $\omega_2 - \omega_3$, whereupon IF filter 223 extracts the lower sideband signal to which a carrier component has been added. If the frequency region in which processing will be carried out is lowered in this way, less unnecessary processing is performed, which contributes significantly to reducing power consumption.

Third Embodiment

Figure 9:
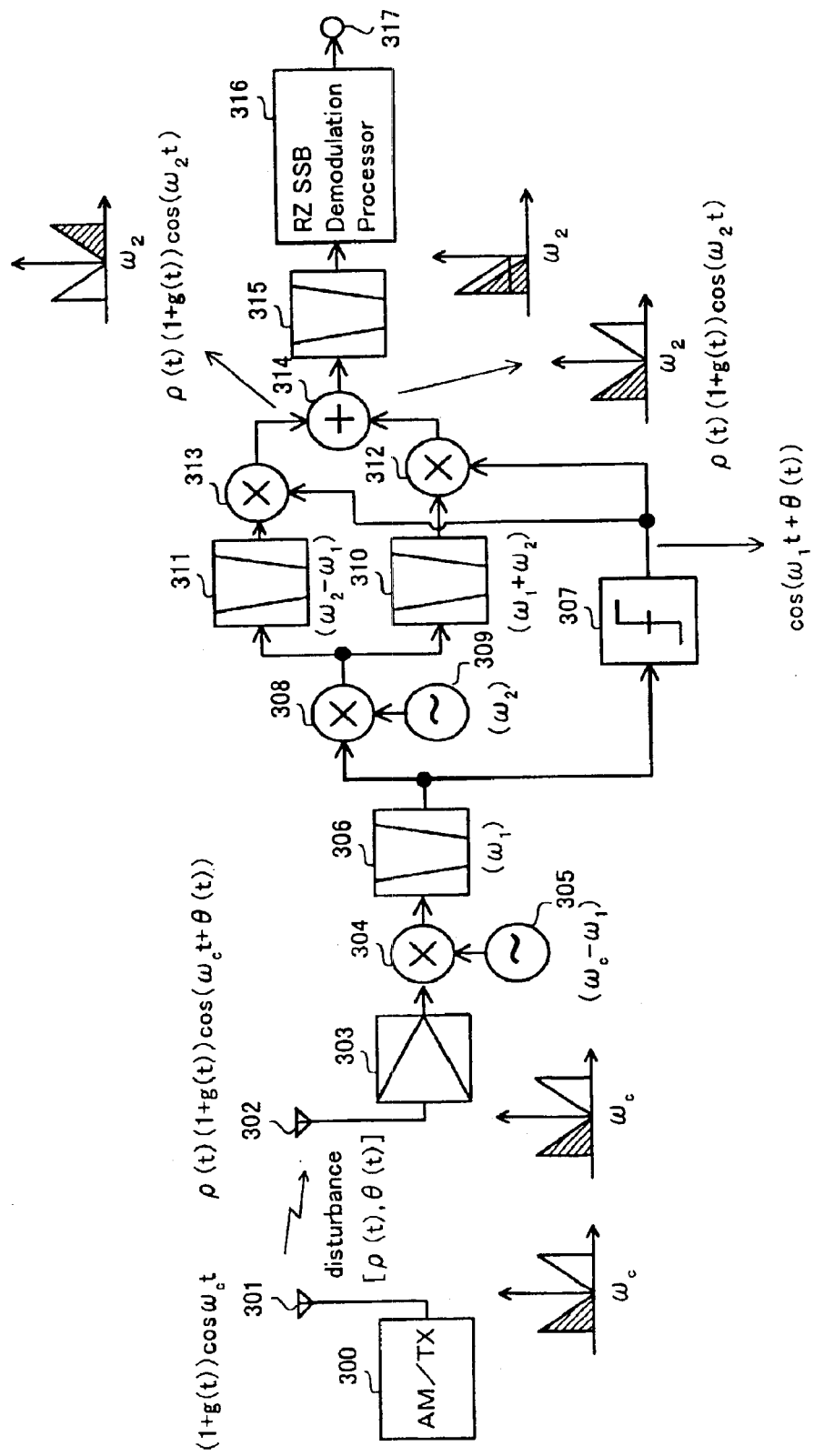
FIG. 9 is a block diagram of a third embodiment of this invention.
Figure 10:
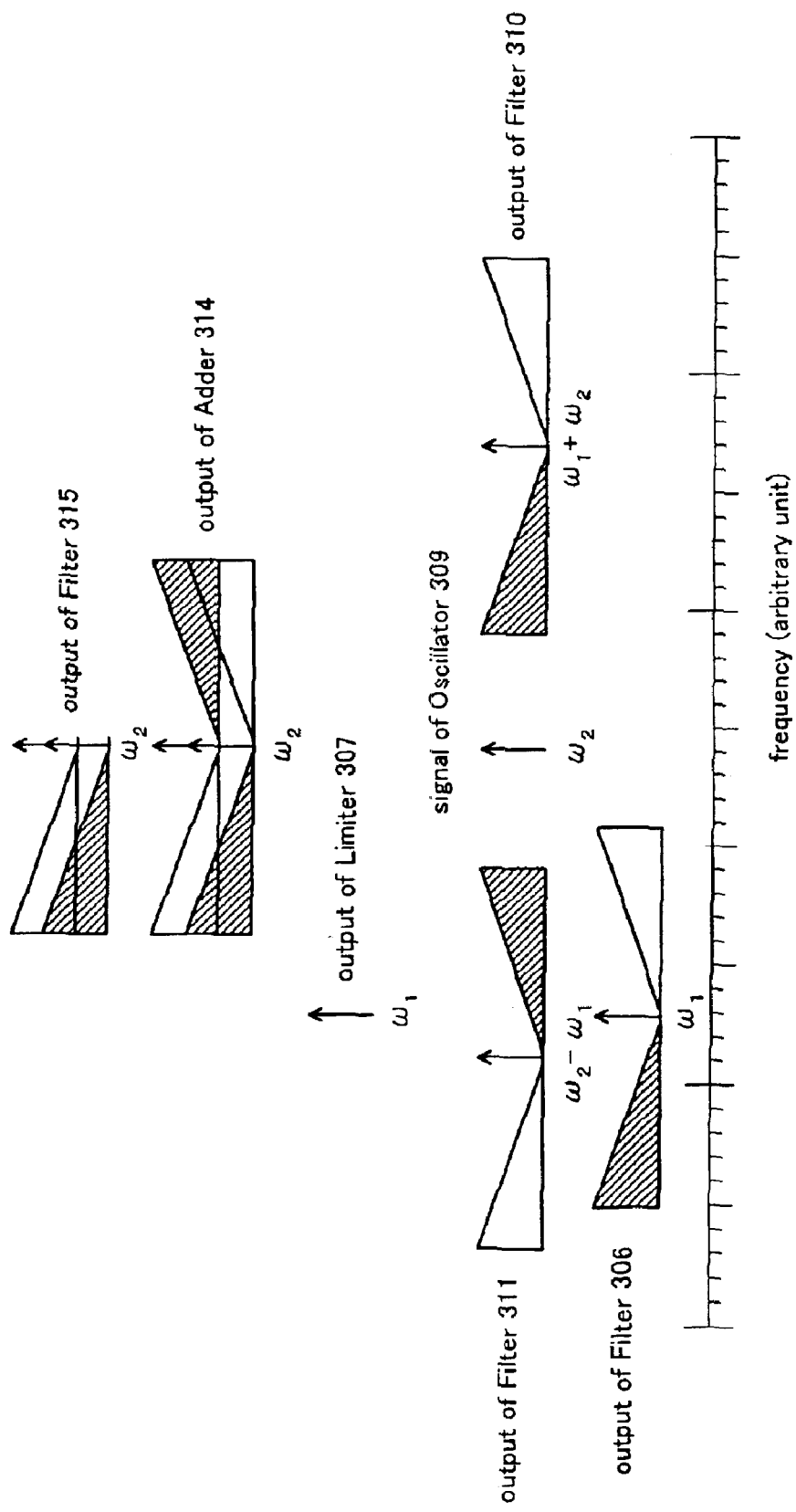
FIG. 10 shows an exemplary arrangement in the frequency domain of sidebands and carrier components during the frequency conversions taking place in the AM signal receiving circuit shown in FIG. 9.

A third embodiment of this invention will now be described with reference to FIG. 9 and FIG. 10. FIG. 9 is a block diagram of this third embodiment, while FIG. 10 shows an exemplary arrangement in the frequency domain of sidebands and carrier components during the frequency conversions taking place in the AM signal receiving circuit of FIG. 9. This third embodiment depicted in FIG. 9 comprises AM transmitter 300, transmitting antenna 301, receiving antenna 302 of the AM receiver, front-end amplifier 303, frequency converter 304, local oscillator 305, IF filter 306, amplitude limiter (hard limiter) 307, frequency converter 308, local oscillator 309, IF filter 310, IF filter 311, frequency converter 312, frequency converter 313, adder 314, IF filter 315, RZ SSB demodulation processor 316, and AM demodulated signal output terminal 317.

A brief description will now be given of signal flow in this third embodiment shown in FIG. 9, and of the functioning of its component circuits.

The output of AM transmitter 300 is transmitted as an amplitude-modulated wave by transmitting antenna 301. This amplitude-modulated wave is received by antenna 302 of the AM receiver and, after it has been amplified by front-end amplifier 303, is converted to a difference frequency signal by frequency converter 304 and local oscillator 305, whereupon the required IF signal is extracted by IF filter 306. This signal is then split into two, and one portion supplied to amplitude limiter (hard limiter) 307, where it is converted to a fixed-amplitude signal. The other split portion of the signal is supplied to frequency converter 308, which forms sum and difference frequencies relative the output signal of local oscillator 309. The sum frequency signal is extracted by IF filter 310, and the difference frequency signal is extracted by IF filter 311. Frequency converter 312 uses the output of amplitude limiter (hard limiter) 307 to form the difference frequency component from the signal that is output from IF filter 310. Frequency converter 313 uses the output of amplitude limiter (hard limiter) 307 to form the sum frequency component from the signal that is output from IF filter 311. The outputs of frequency converter 312 and frequency converter 313 are added by adder 314, whereupon IF filter 315 extracts the lower sideband component, this being a signal from which some unwanted noise components have been removed and which is accompanied by a carrier component. The output of IF filter 315 is supplied to RZ SSB demodulation processor 316 where it is demodulated, and the demodulated signal is output from terminal 317.

The operation of the component circuits will now be described using mathematical expressions. Writing the information signal as g(t), the AM broadcast wave to be transmitted from transmitting antenna 301 is:

$$St3(t) = (1 + g(t))\cos(\omega_c t) \tag{18}$$

where $\omega_c$ in this equation is the angular frequency of the transmitted wave. To ensure that the AM wave is not overmodulated, it is essential that:

$$|g(t)| < 1 \tag{19}$$

During its propagation, the signal radiated from transmitting antenna 301 is subject to multiplicative disturbances which can be represented respectively by $\rho(t)$ and $\theta(t)$ in the amplitude and phase terms. Hence the signal that arrives at AM receiver antenna 302 is given by:

$$Sr3(t) = \rho(t)(1 + g(t))\cos(\omega_c t + \theta(t)) \tag{20}$$

After the received signal has been amplified by front-end amplifier 303, the difference frequency between this received signal and a local oscillator signal from local oscillator 305, which has a center angular frequency of $\omega_c-\omega_1$ and an angular frequency fluctuation of $\delta\omega$, is obtained by means of frequency converter 304. As a result, the received signal is converted to an IF signal with a center angular frequency of $\omega_1$. The required IF signal component alone is extracted by IF filter 306. The extracted signal is found from Equation 20 to be:

$$S31(t)=\rho(t)(1+g(t))\cos(\omega_1\pm\delta\omega)t+\theta(t) \quad (21)$$

Note that thermal noise added by front-end amplifier 303 has been ignored.

The signal described by Equation 21 is split into two. One of the two split portions is supplied to amplitude limiter (hard limiter) 307 where it is converted to a fixed-amplitude signal, given by:

$$S3\text{lim}=\cos((\omega_1\pm\delta\omega)t+\theta(t)) \quad (22)$$

Using local oscillator 309 with angular frequency $\omega_2$, the sum frequency forming function of frequency converter 308 is utilized to convert the other split portion of the signal to an IF signal with a center angular frequency of $\omega_2+\omega_1$. IF filter 310 then extracts only the required IF signal component, giving:

$$S32(t)=\rho(t)(1+g(t))\cos((\omega_2+(\omega_1\pm\delta\omega))t+\theta(t)) \quad (23)$$

In this embodiment as well, the frequency relation $\omega_2>\omega_1$ is used. Local oscillator 309 with angular frequency $\omega_2$ is also used, together with the difference frequency forming function of frequency converter 308, to convert the other split portion of the signal to an IF signal with a center angular frequency of $\omega_2-\omega_1$. IF filter 311 then extracts only the required IF signal component, giving:

$$S33(t)=\rho(t)(1+g(t))\cos((\omega_2-(\omega_1\pm\delta\omega))t-\theta(t)) \quad (24)$$

When the output of amplitude limiter (hard limiter) 307, represented by Equation 22, and the output of IF filter 310, represented by Equation 23, are input to frequency converter 312 and their difference frequency component extracted, the signal obtained is:

$$\begin{aligned}S34(t) &= \rho(t)(1+g(t))\cos(\omega_2 t) \\ &= \rho(t)\cos(\omega_2 t) + \\ &\quad \rho^+(t)\{g^+(t)\cos(\omega_2 t) - H(g^+(t))\sin(\omega_2 t)\}/2 + \\ &\quad \rho^-(t)\{g^-(t)\cos(\omega_2 t) + H(g^-(t))\sin(\omega_2 t)\}/2]\end{aligned} \quad (25)$$

In other words, the angular frequency fluctuation $\delta\omega$ and the disturbance component $\theta(t)$ that were present in the phase term can be completely removed. At the same time, the angular frequency of the carrier component is converted to $\omega_2$. The symbols $\rho^+(t)$ and $\rho^-(t)$ represent the random amplitude fluctuation present in the upper and lower sideband regions respectively.

Likewise, when the output of amplitude limiter (hard limiter) 307, represented by Equation 22, and the output of IF filter 311, represented by Equation 24, are input to frequency converter 313 and their sum frequency component extracted, the signal obtained is:

$$\begin{aligned}S35(t) &= \rho(t)(1+g(t))\cos(\omega_2 t) \\ &= \rho(t)\cos(\omega_2 t) + \end{aligned} \quad (26)$$

-continued
$$\begin{aligned}&\rho^+(t)\{g^+(t)\cos(\omega_2 t) + H(g^+(t))\sin(\omega_2 t)\}/2 + \\ &\rho^-(t)\{g^-(t)\cos(\omega_2 t) - H(g^-(t))\sin(\omega_2 t)\}/2]\end{aligned}$$

In other words, the angular frequency fluctuation $\delta\omega$ and the disturbance component $\theta(t)$ that were present in the phase term can be completely removed. At the same time, the angular frequency of the carrier component is converted to $\omega_2$.

The outputs of frequency converter 312 and frequency converter 313 are added by adder 314, whereupon IF filter 315 extracts the lower sideband component accompanied by a carrier component with angular frequency $\omega_2$.

Frequency stability in the subsequent demodulation processing is dependent only on local oscillator 309. As a result, if angular frequency $\omega_2$ is low, frequency stability is not a practical problem. The use of sharp IF filter 315 serves to extract the lower sideband signal, this being a signal from which some unwanted noise components have been removed and to which a carrier component has been added.

Omitting remaining noise components from the mathematical expression and drawing on Equations 25 and 26, the signal extracted by IF filter 315 is found to be:

$$\begin{aligned}S36(t) &= 2\rho(t)\cos(\omega_2 t) + \\ &\quad \rho^+(t)\{g^+(t)\cos(\omega_2 t) + H(g^+(t))\sin(\omega_2 t)\}/2 + \\ &\quad \rho^-(t)\{g^-(t)\cos(\omega_2 t) + H(g^-(t))\sin(\omega_2 t)\}/2]\end{aligned} \quad (27)$$

Because the second and third terms of Equation 27 were originally the upper and lower sidebands, respectively, in the transmitted wave, a diversity effect can be anticipated, since the two sidebands will experience different degrees of deterioration during propagation. As mentioned in the description of the first embodiment, it is evident that the lower sideband signal given by Equation 27 can be used as an RZ SSB signal. Accordingly, the use of an RZ SSB demodulation processor enables the disturbance component $\rho(t)$ to be removed, which, coupled with the diversity effect, enables a high-quality demodulated information signal to be obtained.

If the circuit shown in FIG. 9 is implemented using a DSP device, in order to reduce the DSP power consumption, it is necessary to lower the sampling frequency of the RZ SSB demodulation processor. It is possible to shift the processing frequencies to a lower frequency region by inserting a frequency converter in the output of adder 314. An example of such processing will be described below.

Figure 11:
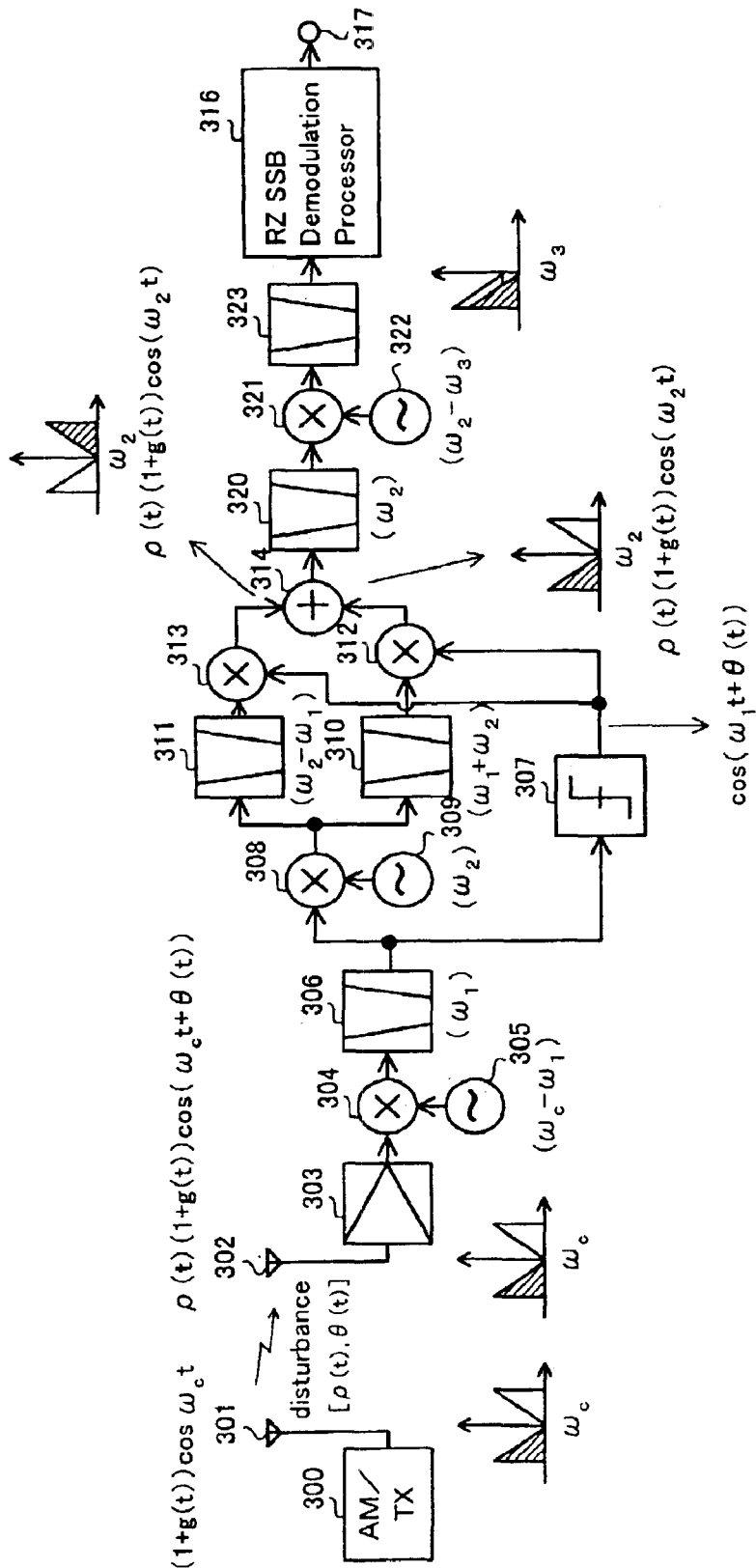
FIG. 11 is a block diagram of a configuration wherein the RZ SSB demodulation processing is performed in a lower frequency region, and represents a modification of the third embodiment of the invention.
Figure 12:
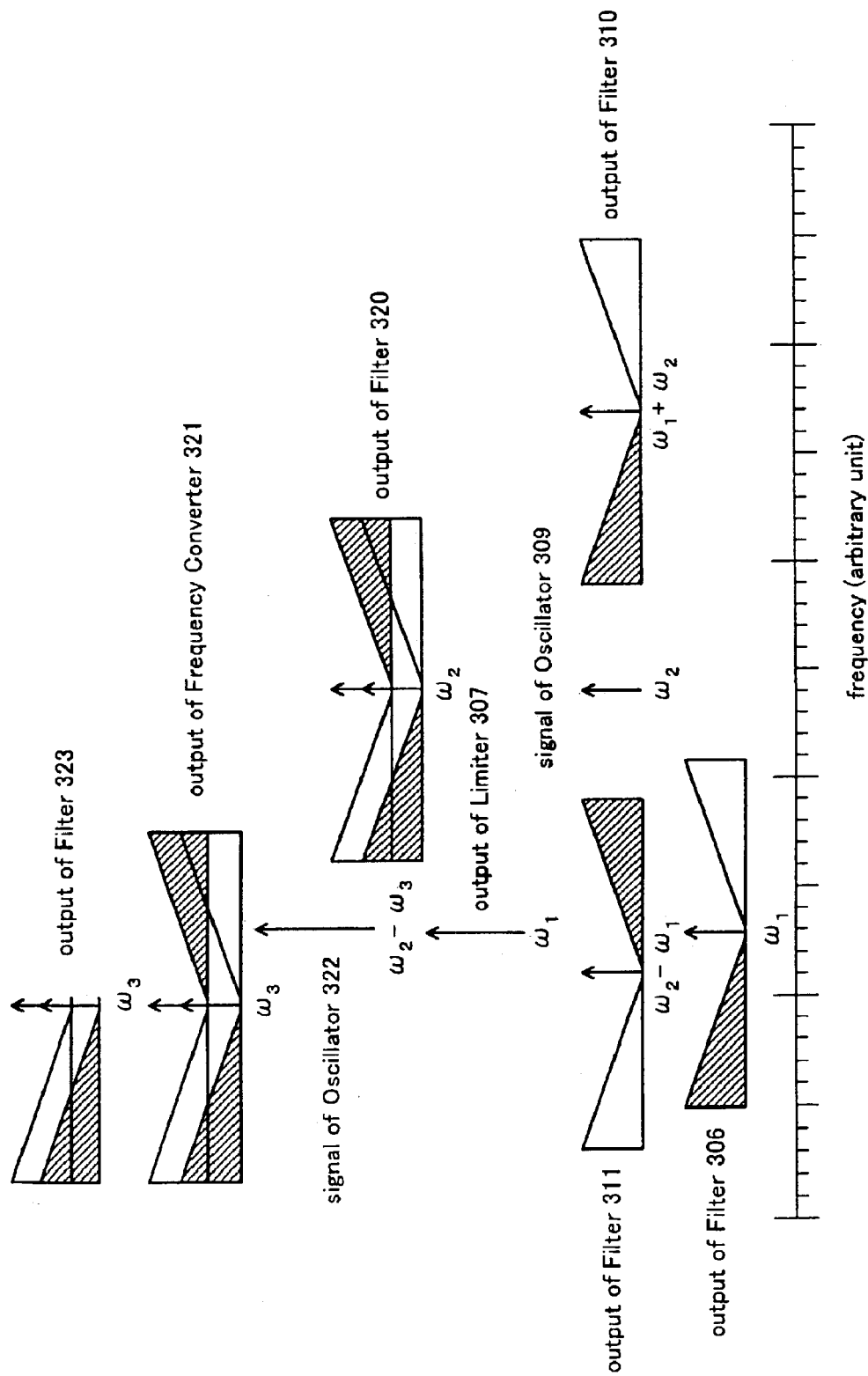
FIG. 12 shows an exemplary arrangement in the frequency domain of sidebands and carrier components during the frequency conversions taking place in the AM signal receiving circuit shown in FIG. 11.

FIG. 11 is a block diagram showing an example in which the signal processing frequency of the receiving circuit shown in FIG. 9 has been further lowered. FIG. 12 shows an exemplary arrangement in the frequency domain of sidebands and carrier components during the frequency conversions taking place in the AM signal receiving circuit shown in FIG. 11. The modified version of the third embodiment that is depicted in FIG. 11 comprises, in place of IF filter 315 shown in FIG. 9, IF filter 320, frequency converter 321, local oscillator 322, and IF filter 323.

A brief description will be given of the operation of the circuit depicted in FIG. 11. IF filter 320 is used to extract an AM signal of angular frequency $\omega_2$ from the output of adder 314. This is converted to a lower frequency by frequency converter 321, using the output of local oscillator 322 with angular frequency of $\omega_2-\omega_3$, whereupon IF filter 323 extracts a lower sideband signal with added carrier component. If the frequency region in which processing has to be carried out is lowered in this way, less unnecessary processing is performed, which contributes significantly to reducing power consumption.

As has been described above, the present invention provides the following benefits:

1. A demodulated signal with frequency characteristics that are faithful to the frequency characteristics of the transmitted wave is obtained, and the quality of the demodulated signal is better than that obtained with a conventional receiving circuit.
2. Receiving characteristics are resistant to external multiplicative noise resulting from fading and so forth, and hence the quality of the demodulated signal is improved.
3. Maintaining the advantages of a conventional AM receiver, the invention is configured to provide a receiving circuit whereby the demodulated signal that is obtained is independent of frequency fluctuations in the receiver. As a result, an inexpensive receiver can be manufactured.
4. Improved demodulation quality is achieved by configuring the receiving circuit so that, by using both the upper sideband and the lower sideband obtained by the AM modulation, a frequency diversity effect is obtained.

What is claimed is:

1. An amplitude-modulated signal receiving circuit for receiving and demodulating an amplitude-modulated signal having a phase term, said receiving circuit comprising: extraction means for extracting a full carrier single sideband signal from the received amplitude-modulated signal with remaining carrier component of the received amplitude-modulated signal as that of the extracted full carrier single-sideband signal, and demodulation means for demodulating the information signal from the phase term involved in the extracted full carrier single-sideband signal.

2. The amplitude modulated signal receiving circuit of claim 1, wherein said extraction means comprises frequency-conversion means for removing unwanted phase components, caused for example by the influence of the propagation path on the phase term or by frequency fluctuation of a local oscillator in the receiver, by branching the received amplitude-modulated signal into two and multiplying the two branched signals together after limiting the amplitude of one said branched signal and frequency converting the other branched signal.

3. The amplitude modulated signal receiving circuit of claim 1, wherein said extraction means comprises frequency diversity means for reversing the signal frequency component distribution of the received amplitude-modulated signal in the frequency domain, combining the reversed signal with the received amplitude-modulated signal, and extracting one single-sideband signal from the combined signal.

4. The amplitude-modulated signal receiving circuit of claim 3, wherein said frequency diversity means comprises: means for branching the received amplitude-modulated signal into two; an amplitude limiter for limiting the amplitude of one of the branched amplitude-modulated signals; first frequency-conversion means for using a local oscillator signal to frequency convert the other branched amplitude-modulated signal, and for extracting the difference frequency component and the sum frequency component; second frequency-conversion means for using the output of said amplitude limiter to frequency convert the difference frequency component that has been extracted by said first frequency-conversion means, and for extracting the resulting sum frequency component; third frequency-conversion means for using the output of said amplitude limiter to frequency convert the sum frequency component that has been extracted by said first frequency-conversion means, and for extracting the resulting difference frequency component; and means for adding the output of said second frequency-conversion means and the output of said third frequency-conversion means.

* * * * *